United States Patent [19]

Simons et al.

[11] Patent Number: 4,859,962
[45] Date of Patent: Aug. 22, 1989

[54] VIDEOAMPLIFIER

[75] Inventors: Johannes M. M. Simons, Venlo; Caspar P. M. Michels, Venray, both of Netherlands

[73] Assignee: Oce-Nederland B.V., Venlo, Netherlands

[21] Appl. No.: 172,011

[22] Filed: Mar. 23, 1988

[30] Foreign Application Priority Data

Mar. 25, 1987 [EP] European Pat. Off. ........ 87200538.4

[51] Int. Cl.$^4$ ............................................. H03F 3/45
[52] U.S. Cl. ..................................... 330/260; 330/261
[58] Field of Search ............... 330/260, 261, 294, 311, 330/296

[56] References Cited

U.S. PATENT DOCUMENTS 4,393,355 7/1983 Davis ................................. 330/260

Primary Examiner—Gene Wan
Attorney, Agent, or Firm—Reed Smith Shaw & McClay

[57] ABSTRACT

The present amplifier is designed in such a way that the amplifier will exhibit a linear characteristic in response to small variations of the input signal and a hard switching characteristic in response to large variations of that input signal. Due to the design of this amplifier, the output signal will generally be proportional to the input signal, but will be able to respond more quickly to a sudden increase of the input signal. The present amplifier is particularly useful in an amplifying circuit of a videoamplifier.

13 Claims, 5 Drawing Sheets

VIDEOAMPLIFIER

FIELD OF THE INVENTION

The present invention relates to an amplifier with a broad bandwidth and more particularly to a videoamplifier with a broad bandwidth.

BACKGROUND OF THE INVENTION

If the output signal of an amplifier is treated as a binary signal, the amplifier should have a hard switching characteristic. On the other hand, if the output signal should have a plurality of different values, an amplifier with a linear characteristic should be used. However, the large signal behavior of conventional linear amplifiers has proved not to be satisfactory in certain applications such as videoamplifiers where the output signal must have many different values corresponding to different picture half-tones and must also follow large, rapid changes in the input.

In particular, if a sudden stepwise rise occurs in the input signal of a linear videoamplifier, it is observed that the output signal cannot keep up with the rise of the input signal, because the output voltage of such a videoamplifier is only increased with a limited slew rate. It does not have a hard switching characteristic. Thus, the output signal will reach the desired voltage level only after a certain rise time. If the signal that has to be amplified is a pulse signal which has a pulse width on the order of or even smaller than the rise time of the amplifier, the output signal will not be able to reach its full amplitude. Consequently, the bandwidth of the linear amplifier is limited by this rise time.

A videoamplifier is shown in U.S. Pat. No. 4,414,574. This amplifier is concerned with the problem of cutting off the beam current of a CRT when the input is zero volts. U.S. Pat. No. 3,689,848 shows a voltage-to-current converter circuit having a differential amplifier coupled to the output through transistors in a Darlington configuration. This circuit is designed to simulate a voltage controlled current source with good thermal stability.

It would be desirable, therefore, to provide an amplifier, and more particularly a videoamplifier, which has an increased bandwidth and is capable of reproducing variations in the output level over a wide range of amplitudes, even when the pulse width of the input signal is small. It would also be desirable to have an amplifier which had a linear response to small variations in the input signal and a hard switching response to large variations in the input signal.

SUMMARY OF THE INVENTION

The present invention relates to an amplifier in a one-stage or a multi-stage amplifying circuit which is designed in such a way that it exhibits a linear characteristic in a range of small variations of the input signal and a hard switching characteristic in the range of large variations of the input signal. Due to the hard switching characteristics of the transistor means used in the amplifier, the slew rate of the amplifier is increased and the rise time of the output signal in response to a large stepwise rise of the input signal is reduced. On the other hand, when the variation of the input signal is small or when the input signal is substantially constant after a large stepwise rise, the linear characteristic of the transistor means is predominant so that the output signal is kept at the desired level proportional to the input level.

The present invention provides an amplifier for generating an output signal from an input signal comprising: a first current source connected to a branched circuit; a first transistor means provided in a first branch of the branched circuit, the first transistor means being responsive to the input signal to control a current flowing in the first branch; a second circuit source provided in a second branch of the branched circuit; a second transistor means provided in the second branch between the first current source and the second current source to generate the output signal; and a feedback circuit connected to the output signal and the second transistor means for deriving a control signal for the second transistor means from the output signal. The embodiments of this amplifier, as described hereinafter, result in a simple, low-cost circuit construction and also reduced energy dissipation in the transistor means.

In the amplifier of the present invention, preferably both the first and second transistor means exhibit a linear characteristic in response to small variations in the input signal and a hard switching characteristic in response to large variations in the input signal. As a result, this amplifier is particularly useful in the amplifying circuit of a videoamplifier since it is capable of amplifying typical video signals such as a pulse-like signal whose amplitude varies between sixteen distinct values corresponding to sixteen different picture half-tones. Even if the frequency of the input signal to a videoamplifier of the present invention is large, such as 150 to 200 MHz, the maximal rise time of the output signal of the amplifier will be smaller than the pulse width so that all sixteen output levels will be fairly distinguishable from each other.

Other details, objects and advantages of the present invention will become more readily apparent from the following description and accompanying drawings of presently preferred embodiments thereof.

BRIEF DESCRIPTION OF THE DRAWINGS

In the accompanying drawings, preferred embodiments of the present invention are illustrated, by way of example only, wherein.

DESCRIPTION OF THE PREFERRED EMBODIMENTS

Figure 1:
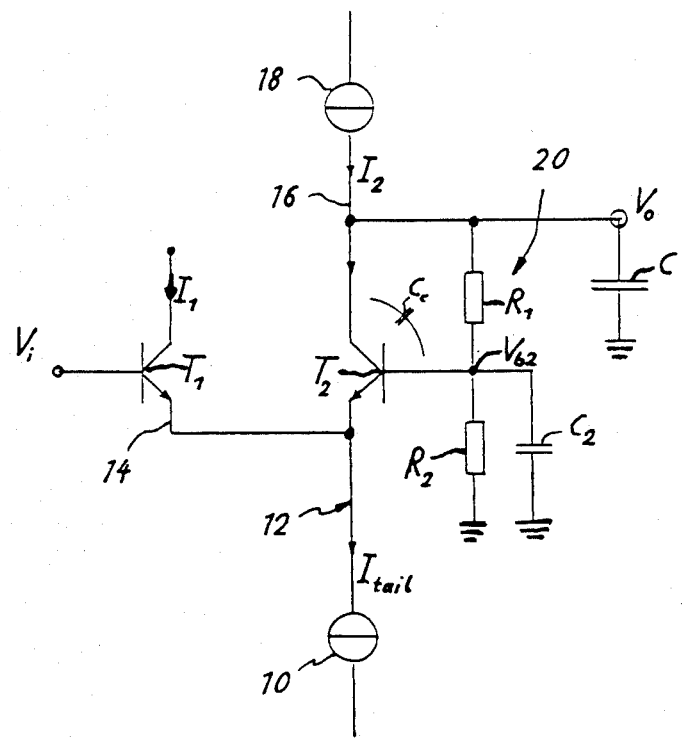
FIG. 1 is a circuit diagram showing an embodiment of the amplifier according to the present invention.

As shown in FIG. 1, the amplifier of the present invention comprises a first current source 10, preferably a constant current source, connected to a branched circuit 12 which has first and second parallel branches, 14 and 16, respectively, connected in series to current source 10. The first branch 14 includes a first transistor means, preferably transistor $T_1$, which has its collector connected to a positive voltage terminal. The input signal to the amplifier, preferably voltage $V_i$, is supplied to the base of transistor $T_1$.

The second branch 16 includes a second transistor means, preferably transistor $T_2$, the collector of which is connected to a second current source 18, preferably a constant current source. The output signal of the amplifier, preferably voltage $V_o$, is picked up at a point between current source 18 and transistor $T_2$. A capacitive load is connected to the output of the amplifier and is represented by a capacitor C. A feedback circuit 20 for controlling base voltage $V_{b2}$ of transistor $T_2$ is connected to second constant current source 18 and the base of transistor $T_2$ and preferably comprises a resistor $R_1$ connected between the collector and the base of transistor $T_2$, and a resistor $R_2$ and a capacitor $C_2$ connected in parallel between the base of transistor $T_2$ and ground.

Preferably, transistors $T_1$ and $T_2$ are of the same type and current $I_2$ flowing through current source 18 is one half of current $I_{tail}$ flowing through current source 10. Consequently, current $I_1$ flowing through transistor $T_1$ is equal to current $I_2$ and, therefore, the base voltage $V_{b2}$ of transistor $T_2$ is normally equal to the input voltage $V_i$.

In response to small or slow variations of input voltage $V_i$, base voltage $V_{b2}$ changes in accordance with $V_i$. If, for instance, input voltage $V_i$ is increased, the base-emitter voltage drop across transistor $T_2$ is reduced so that the emitter voltage $V_e$ of both transistors $T_1$ and $T_2$ becomes larger. As the base-emitter voltage of transistor $T_2$ tends to be reduced, the voltage drop across transistor $T_2$ is increased and consequently output voltage $V_o$ is also increased. Base voltage $V_{b2}$ of transistor $T_2$ is increased due to the effect of the voltage dividing resistors $R_1$ and $R_2$. A new equilibrium is reached when $V_{b2}$ equals the new level of input voltage $V_i$. The amplification factor A of the amplifier is given by the following equation:

$$A = V_o/V_i = V_o/V_{b2} = 1 + R_1/R_2 \qquad (1)$$

Hard switching occurs in the event there is a large sudden increase in the input voltage $V_i$. When this occurs, feedback circuit 20 increases base voltage $V_{b2}$ of transistor $T_2$ only with a certain delay which in the present embodiment is determined by the capacitance of capacitors C and $C_2$. In this situation, transistors $T_1$ and $T_2$ behave like switches with transistor $T_1$ being fully opened while transistor $T_2$ is fully closed (i.e., the maximum current is flowing through transistor $T_1$ while none is flowing through transistor $T_2$). Consequently, all of current $I_2$ is available for charging load capacitor C. This results in the desired superproportional increase in the output voltage $V_o$.

During the hard switching of transistors $T_1$, $T_2$, the slew rate, i.e., the maximal rate of increase of output voltage $V_o$ is given by equation (2):

$$V_o = I_2/C_{tot} \qquad (2)$$

wherein $C_{tot}$ is the total output capacitance. If $V_o$ is a sinusoidal output signal with a maximum amplitude of $V_{max}$, then the bandwidth (indicated by f(−3 dB) is given by equation (4). Equation (3) shows some of the intermediate substitutions made in equation (2) to get equation (4).

$$(V_{max}/\sqrt{2}) \cdot 2\pi \cdot f(-3dB) = I_2/C_{tot} = (\tfrac{1}{2})I_{tail}/C_{tot} \qquad (3)$$

-continued $$f(-3dB) = (\tfrac{1}{2})I_{tail} \cdot \sqrt{2} / (2\pi \cdot C_{tot}V_{max}) \qquad (4)$$

Using equation (4), one can see that if the maximum output amplitude $V_{max}$ is 10 V and the total output capacitance is $8_pF$, and if $I_{tail}$ is set to 108 mA, the bandwidth f(−3 dB) is as large as 150 MHz.

The capacitance of $C_2$ should be adjusted so as to optimize the small signal behavior of the amplifier. Considering a straight frequency curve, $C_2$ should be on the order of:

$$C_2 = 2 \cdot re \cdot A \cdot (C + C_c)(1/R_1 1/R_2) + C_c R_1/R_2 \qquad (5)$$

wherein $C_c$ is the collector-base capacitance of transistor $T_2$, re is the emitter impedance (i.e. $U_{BE}/I_C$) of transistor $T_2$ and A is the amplification factor as shown in equation (1).

Figure 2:
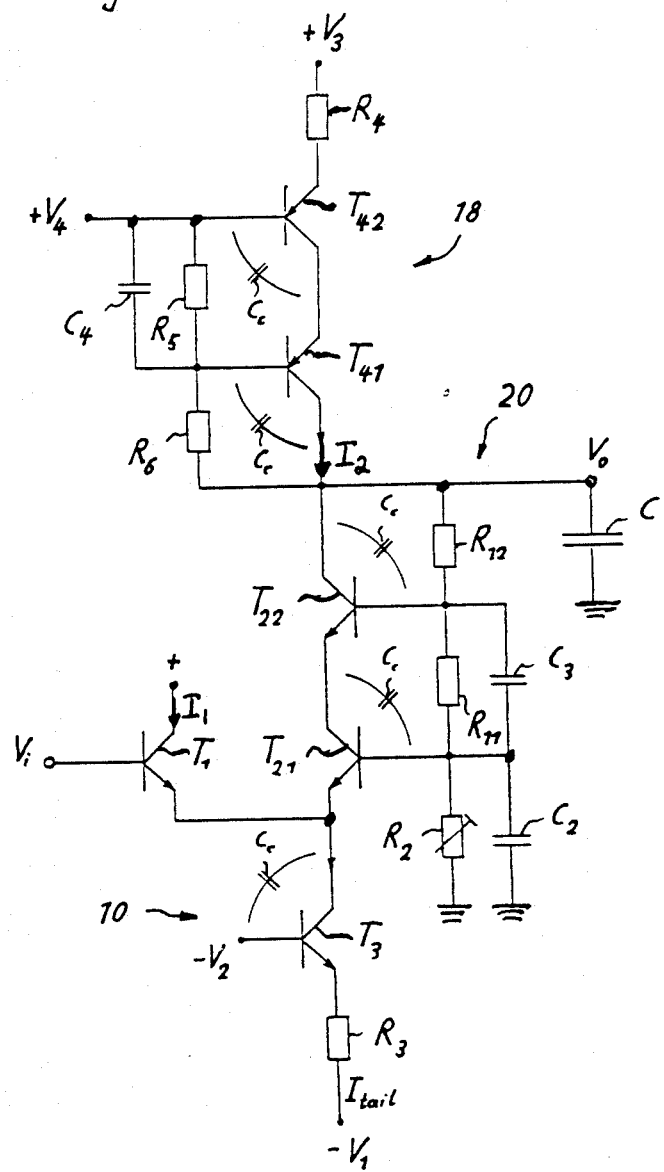
FIG. 2 shows a circuit diagram of a modification of the embodiment shown in FIG. 1.

FIG. 2 shows a circuit diagram of a modification of the amplifier shown in FIG. 1 wherein: transistor $T_2$ has been replaced by a series connection of two transistors $T_{21}$ and $T_{22}$; resistor $R_1$ has been replaced by a series connection of two resistors $R_{11}$ and $R_{12}$; the base of transistor $T_{22}$ is connected to a point between resistors $R_{11}$ and $R_{12}$; and a capacitor $C_3$ having a value substantially equal to $C_c$ is provided for compensating the influence of the collector-base capacitance $C_c$ of transistor $T_{21}$ and is connected in parallel to resistor $R_{11}$.

Current source 10 is preferably formed by a transistor $T_3$ and an emitter resistor $R_3$ which is connected to a negative voltage terminal $V_1$. The base of transistor $T_3$ is connected to another negative voltage terminal $V_2$. Current source 18 is preferably formed by a series connection of two transistors $T_{41}$ and $T_{42}$ and an emitter resistor $R_4$ connected to a positive voltage terminal $V_3$. The base of transistor $T_{42}$ is connected to voltage terminal $V_4$. The base of transistor $T_{41}$ is connected to voltage terminal $V_4$ and to output terminal $V_o$ through resistors $R_5$ and $R_6$ respectively. A capacitor $C_4$ is connected in parallel with resistor $R_5$ and has a capacitance substantially equal to the capacitance $C_c$ of transistor $T_{42}$.

The advantage of having a series of transistors ($T_{21}$ and $T_{22}$) and ($T_{41}$ and $T_{42}$) instead of single transistors ($T_1$ and $T_2$) is that the power dissipated in each transistor is reduced and the collector-emitter tension of each transistor is reduced.

Preferably, transistors $T_1$, $T_{21}$ and $T_3$ are npn-transistors of the same type. They have a very small collector-base capacitance (e.g. $C_c = 2$ pF) and a limit frequency of 2 GHz. The emitter current gain $\alpha'$ (i.e. $h_{FE}$) is about 50. Preferably, transistors $T_{41}$ and $T_{42}$ are pnp-transistors that also have a small collector-base capacitance substantially equal to that of transistors $T_{21}$ and $T_{22}$.

Preferably, the following values are used in the embodiment shown in FIG. 2. The voltage $V_1$ is on the order of −5 V while the voltage $V_3$ is about 35 V. The resistance of resistors $R_{11}$, $R_{12}$, $R_5$ and $R_6$ is about 1kΩ and the resistance of $R_2$ is about 100Ω. If input voltage $V_i$ varies in a range of 0.1 to 1.1 V, output voltage $V_o$ will vary in a range of approximately 5 to 25 V. Preferably, current $I_{tail}$ is about 80 mA, output capacitance C is about 4 pF and capacitance $C_2$ is approximately 50 pF.

Figure 3:
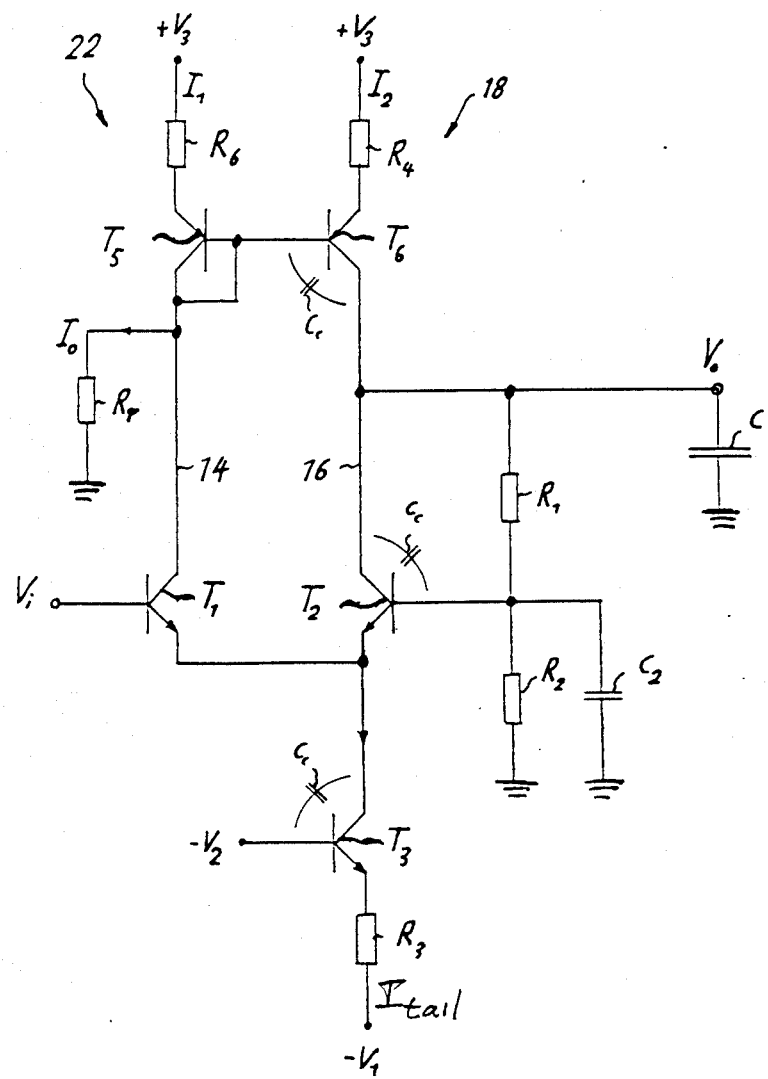
FIG. 3 is a circuit diagram showing a second embodiment of the amplifier according to the present invention.

A different embodiment of the present invention is shown in FIG. 3. This embodiment is different from the previously described embodiment in that the collector of transistor $T_1$ is connected to another current source 22 formed by a pnp-transistor $T_5$ and an emitter resistor R₆ connected to positive voltage terminal $V_3$. The collector of transistor $T_5$ is directly connected to the base of this transistor and is also connected to ground via a resistor $R_7$ which has a comparatively high resistance. Alternatively, resistor $R_7$ can even be omitted. Current source 18 is formed by a single transistor $T_6$, the base of which is directly coupled to the base of transistor $T_5$.

If transistor $T_1$ opens, the base voltage of transistor $T_5$ drops so that the current $I_1$ delivered by current source 22 increases. As current sources 18 and 22 are interlocked with each other due to the common potential of the bases of transistors $T_6$ and $T_5$, the increase in current $I_1$ is reflected by a similar increase in current $I_2$. If transistor $T_1$ is fully open and transistor $T_2$ is fully closed, $I_2$ becomes equal to $I_{tail}$. Consequently, the slew rate of this embodiment is twice as high as in the embodiments of FIGS. 1 and 2.

Figure 4:
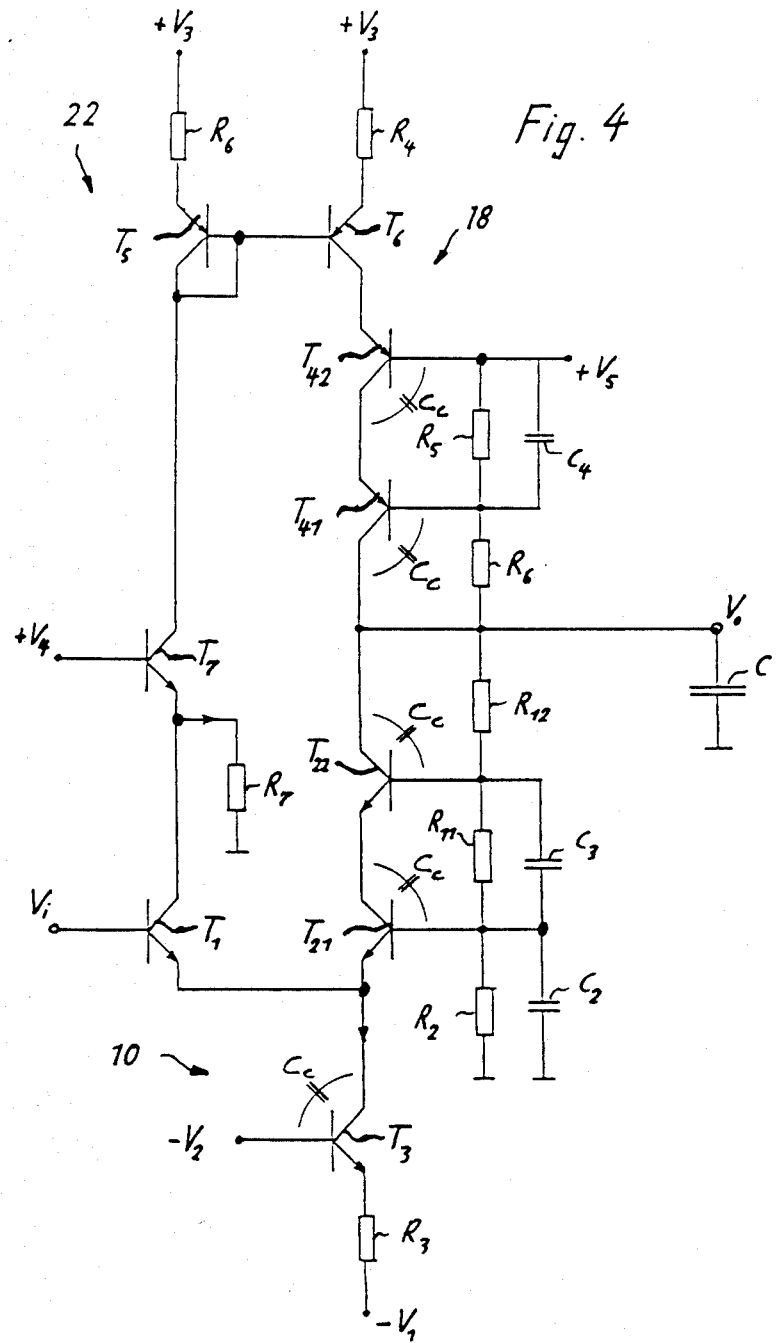
FIG. 4 shows a circuit diagram of a modification of the embodiment shown in FIG. 3.

In the modified amplifier shown in FIG. 4, single transistor $T_2$ is again replaced by a series of transistors. Current source 22 includes a transistor $T_7$ interposed between the collector of transistor $T_5$ and the connecting point of resistor $R_7$. The base of transistor $T_7$ is connected to a constant voltage terminal $V_4$. Current source 18 comprises transistor $T_6$ as described in conjunction with FIG. 3 and transistors $T_{41}$ and $T_{42}$ as described in connection with FIG. 2. The only difference is that the base of transistor $T_{42}$ is connected to a positive voltage terminal $V_5$ rather than $V_4$. Voltage $V_5$ is smaller than $V_3$ but larger than $V_4$.

Figure 5:
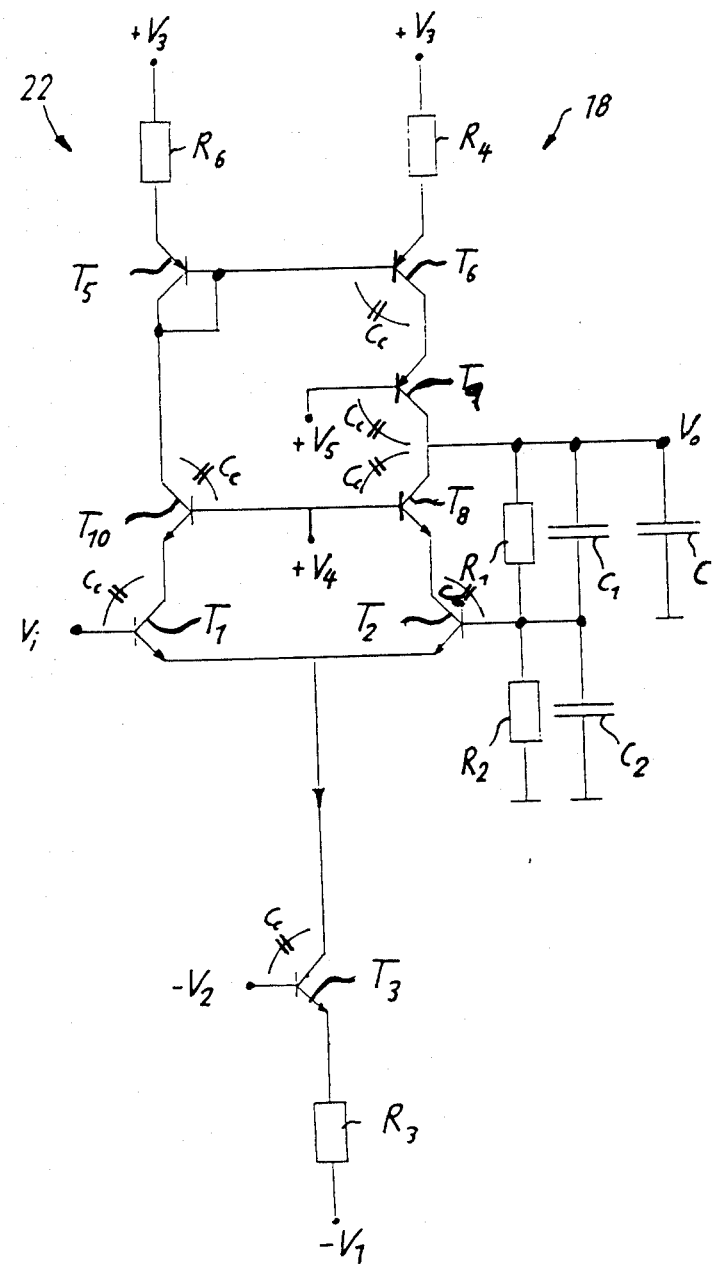
FIG. 5 shows a circuit diagram of another modification of the embodiment shown in FIG. 3.

FIG. 5 shows another modification of the amplifier shown in FIG. 3. Additional transistors $T_8$ and $T_9$ are connected in series between transistors $T_2$ and $T_6$. Another transistor $T_{10}$ is connected between transistors $T_1$ and $T_5$. The bases of transistors $T_8$ and $T_{10}$ are connected to constant voltage terminal $V_4$, and the base of the transistor $T_9$ is connected to constant voltage terminal $V_5$. A capacitor $C_1$ is connected in parallel with resistor $R_1$ and resistor $R_7$ is removed.

In the amplifier shown in FIG. 5, preferably, voltage $V_1$ has a value of about $-5$ V, while voltage $V_3$ has a value of about 42 V. The voltages of $V_4$ and $V_5$ are selected in such a manner that transistors $T_8$, $T_9$ and $T_{10}$ are not saturated. For example, preferably, $V_4$ is set to 4 V, and $V_5$ is set to 38 V. As a result, the voltage drop across transistors $T_1$ and $T_2$, and across transistors $T_5$ and $T_6$ will be comparatively small.

In general, the collector-base capacitance of a transistor is dependent on the collector-base voltage $V_{CB}$. The amplifier shown in FIG. 5 has the advantage that the collector-base capacitance $C_c$ of transistors $T_1$, $T_2$ and $T_6$ is almost constant, so that the influence of changes of the input and output voltages on the collector-base capacitance and hence on the frequency curve of the amplifier is eliminated. Specifically, when output voltage $V_o$ changes, the collector-base capacitance $C_c$ of transistor $T_2$ and, consequently, the input capacitance $C_{in}$ of this transistor is almost constant. The sum of the collector-base capacitance $C_c$ of transistors $T_8$ and $T_9$ is constant as well. Thus, the frequency curve of the amplifier is fixed by the constant values of $R_1$, $C_1$, $R_2$, $C_2$, and $C_{in}$.

Capacitor $C_1$ is provided to make the proper selection of capacitor $C_2$ less critical. The value of the capacitance of $C_1$ should be chosen as low as practically possible. A straight frequency curve is obtained if:

$$C_2 + C_{in} \approx C_1 \cdot R_1 / R_2 \qquad (6)$$

The total output capacitance $C_{tot}$ is given by the following equation:

$$C_{tot} = C + 2C_c + \frac{1}{1/C_1 + 1/C_2} \qquad (7)$$

In a preferred embodiment, C has a value of 4 pF, $C_c$ has a value of 1 to 2 pF, and $C_1$ is set to 1 pF, while $C_2$ is set to about 6 to 12 pF. This results in $C_{tot}$ having a value of about 7 to 9 pF. Transistors $T_9$ and $T_{10}$ prevent large changes of the collector-base voltages of transistors $T_6$ and $T_1$, respectively, so that the collector-base capacitances $C_c$ of transistors $T_6$ and $T_1$ are also substantially constant. Furthermore, transistors $T_8$, $T_9$ and $T_{10}$ dissipate the largest part of the power, so that transistors $T_1$, $T_2$, $T_5$, and $T_6$ have very low power dissipations, typically smaller than 1 watt. This has the advantage that the temperature offset of these transistors is reduced.

While presently preferred embodiments of practicing the invention have been shown and described with particularity in connection with the accompanying drawings, the invention is not limited to the examples shown and described herein. It will occur to a person skilled in the art that the examples shown and described herein may be modified in various ways without departing from the spirit of the present invention. Such modifications are considered to be within the scope of the following claims.

What is claimed is:

1. An amplifier for generating an output signal from an input signal comprising:
   a first current source connected to a branched circuit;
   a first transistor means provided in a first branch of the branched circuit, the first transistor means being responsive to the input signal to control a current flowing in the first branch;
   a second current source provided in a second branch of the branched circuit;
   a second transistor means provided in the second branch between the first current source and the second current source to generate the output signal; and
   a feedback circuit connected to the second current source and the second transistor means for deriving a control signal for the second transistor means from the output signal.

2. An amplifying circuit comprising at least one amplifier as described in claim 1 wherein the first and second transistor means exhibit a linear characteristic in response to small variations in the input signal and a hard switching characteristic in response to large variations in the input signal.

3. The amplifying circuit as described in claim 2 wherein the amplifier comprises part of a videoamplifier.

4. The amplifying circuit as described in claim 2 wherein the first and second current sources are constant current sources.

5. The amplifying circuits described in claim 2, wherein the input and output signals are voltages.

6. An amplifying circuit as described in claim 2, wherein the second transistor means comprises a plurality of transistors connected in series.

7. The amplifying circuit as described in claim 2 wherein the second current source comprises a plurality of transistors connected in series.

8. An amplifying circuit as described in claim 2 wherein the feedback circuit comprises a first resistor connected between the output signal and the base of the second transistor means, a second resistor connected between the base of said second transistor means and ground and a capacitor connected in parallel to the second resistor.

9. An amplifying circuit as described in claim 8 wherein the feedback circuit comprises a second capacitor connected in parallel to the first resistor.

10. An amplifying circuit as described in claim 8 wherein a current flowing in the first branch is provided by a third current source and wherein the second current source is interlocked with the third current source such that a change in the current flowing in the first branch is reflected by a like change in a current provided by the second current source.

11. The amplifying circuit described in claim 10 wherein the second and third current sources comprise a plurality of transistors connected in series.

12. An amplifying circuit as described in claim 2 wherein the second branch comprises first and second additional transistors that are connected in series between the second transistor means and the second current source, the output signal being picked-up at a point between the additional transistors, and wherein the bases of the additional transistors are respectively connected to different constant voltage terminals, the voltages of which are selected in such a manner that the additional transistors are not saturated and the voltage drop across each additional transistor is larger than the voltage drop across the second transistor means and is also larger than the voltage drop across an output transistor of the second current source.

13. An amplifying circuit as described in claim 12 wherein a third additional transistor is interposed between the first current source and the first transistor means and has its base connected to the same voltage terminal as the first additional transistor, the first additional transistor being connected directly to the second transistor means.

* * * * *